United States Patent [19]
Babcock et al.

[11] Patent Number: 5,466,512
[45] Date of Patent: Nov. 14, 1995

[54] FLAME RETARDANT ORGANOSILICON POLYMER COMPOSITION, PROCESS FOR MAKING SAME, AND ARTICLE PRODUCED THEREFROM

[75] Inventors: Laura M. Babcock; John K. Bard; Raymond T. Leibfried, Sr., all of New Castle County, Del.

[73] Assignee: Hercules Incorporated, Wilmington, Del.

[21] Appl. No.: 125,886

[22] Filed: Sep. 24, 1993

Related U.S. Application Data

[62] Division of Ser. No. 839,610, Feb. 21, 1992, Pat. No. 5,298,536.

[51] Int. Cl.$^6$ .......................... B32B 25/20; C08F 283/12; C08L 83/04

[52] U.S. Cl. .......................... 428/209; 428/391; 428/447; 523/179; 523/201; 525/479; 528/15; 528/25; 528/31; 524/862; 524/588; 524/706; 524/708; 524/709; 524/733; 524/739; 524/763; 524/416; 524/414; 524/789; 524/788

[58] Field of Search .......................... 523/179, 201; 525/479; 528/15, 25, 31; 524/862, 588, 706, 708, 709, 739, 733, 763, 416, 414, 789, 788, 791, 425, 449, 442; 428/447, 391, 209

[56] References Cited

U.S. PATENT DOCUMENTS

| | | | |
|---|---|---|---|
| 3,383,356 | 5/1968 | Nielsen | 260/46.5 |
| 3,516,941 | 6/1970 | Matson | 252/316 |
| 4,001,140 | 1/1977 | Foris et al. | 252/316 |
| 4,042,550 | 8/1977 | Tuller et al. | 260/280 P |
| 4,087,376 | 5/1978 | Foris et al. | 252/316 |
| 4,440,880 | 4/1984 | Albanesi et al. | 523/205 |
| 4,567,214 | 1/1986 | Ilardo | 523/216 |
| 4,594,730 | 6/1986 | Adkins | 523/208 |
| 4,675,249 | 6/1987 | Bowman | 428/402.21 |
| 4,698,215 | 10/1987 | Albanesi et al. | 524/414 |
| 4,740,537 | 4/1988 | Silver | 523/200 |
| 4,877,820 | 10/1989 | Cowan | 523/222 |
| 4,900,779 | 2/1990 | Leibfried | 524/862 |
| 4,902,731 | 2/1990 | Leibfried | 523/221 |
| 5,008,360 | 4/1991 | Bard et al. | 528/25 |
| 5,013,809 | 5/1991 | Leibfried | 524/862 |
| 5,025,048 | 6/1991 | Burnier | 524/99 |
| 5,068,303 | 11/1991 | Bard et al. | 528/25 |
| 5,077,134 | 12/1991 | Leibfried | 428/447 |
| 5,109,037 | 4/1992 | Chakrabarti et al. | 523/202 |
| 5,118,735 | 6/1992 | Burnier | 524/99 |
| 5,124,375 | 6/1992 | Leibfried | 523/222 |
| 5,124,423 | 6/1992 | Leibfried | 528/15 |
| 5,147,945 | 9/1992 | Leibfried | 525/475 |
| 5,171,817 | 12/1992 | Barnum et al. | 528/15 |

FOREIGN PATENT DOCUMENTS

| | | |
|---|---|---|
| 2075469 | 3/1993 | Canada . |
| 479310 | 4/1992 | European Pat. Off. . |
| 482404 | 4/1992 | European Pat. Off. . |

OTHER PUBLICATIONS

"Phosphorus Based Catalyst Retards for Silicon Carbon Resin Systems", Research Disclosure 326103 (Jun. 1991).
International Tin Research Institute; Data Sheet DS 11; Zinc Stannates.
International Tin Research Institute; Data Sheet DS 12; Smoke Suppression Using Zinc Stannates.
Technical Information; Thermoguard™ FR; Flame Retardant; ATOChem North America, Inc.
Exolit® Flame Retardant; Hoechst Celanese; Specialty Chemicals Group Polymer Additives.
AMGARD® CPC; Albright & Wilson Americans a Tenneco Company.
AMGARD; AMGARD MC; Albright & Wilson; Flame Retardants.
Organo–phosphines from Cyanamid.
Flame Retardant Chemicals; Great Lakes Chemical Corporation.
Occidental Chemical Corporation; Detergent & Specialty Products Division Dechlorane Plus®.
OxyChem; Electrochemicals & Specialty Products; Dechlorane Plus® $C_{18}H_{12}Cl_{12}$.
Dech Plus Digest; Occidental Chemical Corporation; Summer 1991; vol. 4, No. 1.
Ethyl Chemicals Group; Bromine Chemicals Division; Saytex 120; Flame Retardants.
Firebrake® ZB Zinc Borate; The Unique Multifunctional Additive by Kevin K. Shen.
Flame Retardant Chemicals; Great Lakes DE–71™; Great Lakes Chemical Corporation; Sep. 2, 1990.
Great Lakes Chemical Flame Retardants; Effective flame retardant performance for a variety of polymer systems.
GE Silicones; SFR 100 Silicone Fluid Compounding Guide.
GE Silicones; SFR 100 Silicone Fluid.
Flame–Retardant Polyolefins Don't Need Halogen; by Prakash Pawar; GE Silicones.
Antimony Oxide from Asarco; Uniform High Quality; Low Impurity Levels.
Dr. John K. Bard; Silicon–Carbon Resins to Boost PWB Use.
Dr. John K. Bard & Dr. Richard L. Brady; A New Moisture Resistant Liquid Encapsulant.
Dr. John K. Bard & Dr. Richard L. Brady; A New Moisture–Resistant Liquid Encapsulant; 42nd ECTC Conference Proc., May 1992.

(List continued on next page.)

*Primary Examiner*—Melvyn I. Marquis
*Assistant Examiner*—Karen A. Dean
*Attorney, Agent, or Firm*—Mark D. Kuller

[57] ABSTRACT

Disclosed are flame retardant organosilicon compositions, wherein the organosilicon compositions comprise residues derived from (a) polycyclic polyens compounds and (b) residues derived from cyclic polysiloxanes, tetrahedral siloxysilanes and linear poly(organohydrosfioxane)s. Preferably the compositions contain flame retardants, such as a phosphorus containing or halogen containing flame retardant, which may be microencapsulated. Also disclosed are processes for making such compositions and articles made from such compositions.

50 Claims, No Drawings

OTHER PUBLICATIONS

J. K. Bard, R. L. Brady, and J. M. Schwark; Processing and Properties of Silicon–Carbon Liquid Encapsulants.

Dr. John K. Bard & Dr. Julia S. Burnier; New Low Dielectric Constant, (I) Moisture Resistant Resin Technology For High Speed/High Frequency Circuit Board Applications.

(II) Dr. John K. Bard & Dr. Julia S. Burnier; New Low Dielectric Constant, Moisture Resistant Resin Technology For High Speed/High Frequency Circuit Board Applications.

Polyclad Laminates, Inc.; PCL–511 Laminates and Prepregs For High Speed Digital Applications.

Organosilicon Composition Containing Hydrocarbon Elastomer; Research Disclosure–Oct. 1991/799–800.

Liquid Encapsulants, Flip Chip Encapsulants and Die Attach Adhesives; Research Disclosure–Mar. 1992/184–187.

Platinum (II) Complexes As Catalysts For Silicon–Carbon Resin Systems; Research Disclosure–May 1992/355–357.

Transfer Molding Compounds For Encapsulation; Research Disclosure–Sep. 1992/707–709.

Underwriter Laboratory's "Standard for Test for Flammability of Plastic Materials for Parts in Devices and Appliances, UL94", Jun. 16, 1988 for UL94–80, Third Edition.

"Organosilicon Compositions Containing Hydrocarbon Elastomers", Research Disclosure 33082 (Oct. 1991).

"Standard Test Methods for A–C Loss Characteristics and Permittivity (Dielectric Constant) of Solid Electrical Insulating Materials", ASTM Designation: D150–87.

FLAME RETARDANT ORGANOSILICON POLYMER COMPOSITION, PROCESS FOR MAKING SAME, AND ARTICLE PRODUCED THEREFROM

This application is a division of application Ser. No. 07/839,610, filed Feb. 21, 1992, allowed and now U.S. Pat. No. 5,298,536.

FIELD OF THE INVENTION

The present invention is directed to the field of organosilicon polymeric materials and articles, and to processes for preparing such materials and articles. More specifically, the polymeric materials comprise (a) residues derived from polycyclic polyenes and (b) residues derived from at least one member selected from the group consisting of cyclic polysiloxanes, tetrahedral siloxysilanes, and linear poly(organosiloxane)s.

BACKGROUND OF THE INVENTION

Leibfried, in U.S. Pat. Nos. 4,900,779, 4,902,731, 5,013,809, and 5,077,134, Bard and Burnier, in U.S. Pat. Nos. 5,008,360 and 5,068,303, and Burnier, in U.S. Pat. No. 5,025,048, describe crosslinked organosilicon polymers and crosslinkable organosilicon prepolymers comprised of polycyclic hydrocarbon residues and cyclic polysiloxanes or siloxysilane residues linked through carbon to silicon bonds, and processes useful for preparing the same. Cowan, in U.S. Pat. No. 4,877,820, and Burnier, in U.S. Pat. No. 5,025,048, disclose crosslinked or crosslinkable linear poly(organohydrosilane) polymers having at least 30% of their ≡SiH groups reacted with hydrocarbon residues derived from polycyclic polyenes. The crosslinked polymers have the desirable characteristics of high glass transition temperature (Tg), low dielectric constant, and low moisture absorption, in addition to other desirable properties. The polymers and prepolymers are useful for electronic applications, such as preparing printed circuit boards (including substantially tack-free prepreg and laminates useful for preparing such circuit boards) And encapsulated electronic components, and structural applications.

All of the above-listed patents are hereby incorporated in their entirety, by reference thereto.

U.S. Pat. Nos. 4,900,779 and 4,902,731 state that the thermoset polymers are fire retardant and burn very slowly when subjected to flame. In addition, these patents state that the organosilicon polymers described therein are tough thermoset polymers which pyrolyze upon heating to a temperature greater than 1000° C. and that this high temperature resistance makes these polymers useful as refractory materials, fire resistant materials, and ablative materials.

While some of the above polymers are fire retardant in that they eventually extinguish when removed from a flame, they are not sufficiently fire retardant (do not self extinguish quickly enough) to meet standards required for many electronic applications.

Accordingly, it is an object of the invention to provide an organosilicon composition that self extinguishes quickly enough to meet fire retardant standards required for electronic applications.

It is also an object of the invention to provide an organosilicon composition that self extinguishes quickly enough to meet fire retardant standards required for electronic applications, and also has properties desirable for electronic applications such as high glass transition temperature (Tg), low dielectric constant, and low moisture absorption.

It is another object of the invention to provide such flame retardancy properties to the organosilicon compositions without adversely affecting processing conditions for forming such organosilicon compositions, for instance without substantial degree of inactivation of the catalyst.

It is a further object of the present invention to provide an organosilicon prepolymer having improved storage stability.

SUMMARY OF THE INVENTION

The invention relates to an organosilicon composition which comprises at least one member selected from the group consisting of an organosilicon polymer and an organosilicon prepolymer. The organosilicon polymer or prepolymer comprises residues of at least one silicon-containing compound and at least one polycyclic polyene compound linked through carbon to silicon bonds. The silicon compound comprises at least one member selected from the group consisting of:

A. cyclic polysiloxane compounds containing at least two hydrosilation reactive ≡SiH groups;

B. tetrahedral siloxylane compounds containing at least two hydrosilation reactive ≡SiH groups; and C. linear poly(organohydrosiloxane) polymers containing at least two hydrosilation reactive ≡SiH groups.

The polycyclic polyene compound contains at least two hydrosilation reactive carbon-carbon double bonds. Preferably, it contains two hydrosilation reactive double bonds in its rings. A substantial portion of at least one member selected from the group consisting of the silicon-containing compound and the polycyclic polyene compound has more than two reactive sites thereon. A 5 inch by ½ inch by ½ inch crosslinked polymer specimen of the organosilicon composition exhibits flammability characteristics which meet the criteria for the UL94V-1 rating, preferably the UL94V-0 rating, according to Underwriters Laboratories Test for Flammability of Plastic Materials UL94 Vertical Burn Test. In embodiments focusing on compositions for certain applications, the tests are specified to be met by 5 inch×½ inch×⅛ inch, 5 inch×½ inch×1/16 inch and 5 inch×½ inch 2 mil specimens.

Preferably, the composition comprises a flame retardant compound or residue thereof. The flame retardant compounds may be reactive or nonreactive. In addition, it may be microencapsulated. Flame retardants are generally present in an amount of about 2 to about 90 weight percent, preferably about 2 to about 60 weight percent, and most preferably about 3 to about 36 weight percent, based on the weight of the composition.

Alternatively, the composition of the present invention comprises an organosilicon polymer or prepolymer in combination with one or more flame retardants. The flame retardant preferably comprises at least one member selected from the group consisting of phosphorus containing compounds and residues and halogen containing compounds and residues. Exemplary are ammonium polyphosphates, residues of ammonium polyphosphates, phosphazenes, residues of phosphazenes, phosphine oxides, residues of phosphine oxides, phosphate esters, residues of phosphate esters, elemental red phosphorus, brominated alkyls, brominated diphenyl oxides, brominated polystyrenes, brominated bisphenol A's, hexachlorocyclopentadiene derivatives, and hexachlorocyclopentadiene residues. The flame retardants may be present in the composition in the form of a compound in admixture with the polymer or may be present in the composition in the form of a residue on the prepolymer or polymer.

The invention also relates to a process for making a flame retardant composition, The process comprises the steps of: (1) providing at least one silicon-containing compound, (2) providing at least one polycyclic polyene compound, (3) providing at least one flame retardant compound, and (4) reacting the silicon-containing compound(s) and the polycyclic polyene compound(s) so that an organosilicon prepolymer or polymer is formed. The flame retardant may be combined directly with the reactants which react to form the prepolymer. In a preferred embodiment, the flame retardant is added after the formation of a prepolymer but before the polymerization of the prepolymer to form the organosilicon polymer. Some flame retardants contain functional groups reactive in hydrosilation and react with the silicon-containing compounds or polycyclic polyene compounds.

The invention also relates to articles of manufacture comprising the cured, crosslinked organosilicon polymer. The article is selected from the group consisting of electronic components comprising the organosilicon composition or an electronic component coated or encapsulated (potted or sealed) with the organosilicon composition. Examples of components include electronic circuit boards, circuit board laminates, circuit board prepregs, semiconductor devices, capacitors, resistors, diodes, transistors, transformers, coils, wires, hybrid circuits, and multichip modules. The article exhibits a flammability which meets the criteria for the UL94V-1 rating, preferably the UL94V-0 rating, according to Underwriters Laboratories Tests for Flammability of Plastic Materials UL94 Vertical Burn Test. Preferably, the article further comprises a flame retardant compound or a residue of a flame retardant compound. The article may contain at least one filler or a substrate which is coated (either fully or partially coated) with the flame retardant crosslinked organosilicon polymer composition.

DETAILED DESCRIPTION OF THE INVENTION

The present invention relates to flame retardant organosilicon compositions, to processes for making the flame retardant organosilicon compositions, and to articles comprising the flame retardant organosilicon compositions.

Herein, "SiH" is used to describe hydrosilation reactable =SiH groups.

As used herein, the term "flame retardant" refers to any agent which, when combined with an organosilicon polymer, inhibits combustion of the polymer. The flame retardant may be nonreactive or reactive, relative to any monomers which react to form the organosilicon polymer described hereinafter.

A current criterion for demonstrating flame retardant properties is to meet the specifications for the Underwriter Laboratory's UL94 tests described in "Standard for Test for Flammability of Plastic Materials for Parts in Devices and Appliances, UL94", Jun. 16, 1988 for UL94-80, Third Edition. Briefly, this test involves burning five samples from the bottom and measuring the flame for the flame to extinguish. Two flame applications on each of the five samples are required. The best rating is V-0, which has the requirement that the total flaming flame for the samples be less than 50 seconds, with no single burn exceeding 10 seconds. The next rating is V-1, which requires the total burn flame to be less than 150 seconds, with no single burn exceeding 30 seconds.

The sample sizes required by the test are ½ inch wide by 5 inches long. The sample thickness is variable but the test must be passed with the thicknesses which will be used. For circuit board laminate this would range from a single sheet to a rigid laminate having a thickness of from 2 mils (1/500 inch) to 60 mils (1/16 inch). Encapsulant formulations are typically tested at ⅛ inch thickness.

So that the organosilicon composition and process are defined with respect to typical uses, they may be defined with respect to crosslinked specimens having thicknesses of ½ inch, ⅛ inch, 1/16 inch and 2 mil. In the case of articles of manufacture, the entire article of manufacture must meet the flame retardancy test for Underwriter Laboratory certification.

As used herein, the term "residue" is defined as a component in a composition which is present as that portion of a reactant which resides upon a larger molecule, which larger molecule is a product of a chemical reaction (e.g. reactions resulting in the formation of prepolymers and polymers), and/or substituents on said polymers and prepolymers. Thus, the term "residue" as used herein, generally refers to that portion of a reactant which resides in the resulting prepolymer or polymer.

The present invention may advantageously comprise at least one "filler". Typical fillers include but are not limited to carbon black, vermiculite, mica, wollastonite, calcium carbonate, sand, glass spheres. glass beads, ground glass, waste glass, fused silica, fumed silica, synthetic silica, glass fibers, and glass flakes. Other useful fillers include the other fiber reinforcements which are described in U.S. Pat. Nos. 4,900,779, 4,902,731, 5,008,360 and 5,068,303 (each of which is incorporated herein in its entirety by reference thereto). Fillers can be present in amounts up to about 90% by weight, preferably 25% to 85% by weight, based on the weight of the composition.

As used herein, the term "substrate" refers to any article which may be coated (either wholly or partially) with the organosilicon composition of the present invention. The article of the present invention preferably comprises a crosslinked organosilicon composition and a flame retardant component (present as a residue and/or in admixture with the polymer). In one preferred embodiment, the article of the present invention comprises an article of manufacture which is coated (wholly or in part) with the crosslinked organosilicon composition having the flame retardant.

As used herein, the term "microencapsulated" is used with reference to materials which are coated so that interaction of the core material with the monomer, prepolymer, and/or polymer is prevented, or at least substantially reduced. A more detailed explanation of this term is provided below.

As used herein, the term "synergist" is defined as a substance which, when employed in combination with one or more flame retardant species, enhances the flame retardancy of the composition.

As described herein, the phrase "at least a substantial portion of a reactive monomer having more than two reactive sites thereon" is met if a substantial portion of at least one of the reactive compounds has more than two reactive sites thereon, so that a desired degree of crosslinking may be produced in a final polymerization (i.e. curing) step. The phrase "reactive monomer" may include the silicon-containing compound and the polycyclic polyene compound. In some embodiments described below additional compounds are considered in determining the necessary number of reactive groups for the desired degree of crosslinking.

The flame retardant (i.e. flame retardant compound or residue) may, in general, comprise any material which has the effect of increasing the level of flame retardancy of a composition. Preferably the flame retardant comprises at least one phosphorus atom or at least one halogen atom.

Phosphorus compounds, such as ammonium polyphosphates and phosphazenes, impart flame retardance to the organosilicon polymer formulations described herein, and are among the preferred flame retardants for use in the present invention. Useful phosphorus flame retardants include microencapsulated ammonium polyphosphate derivatives (such as Exolit® 455 and Exolit® 462 from Hoechst Celanese), intumescent ammonium polyphosphate formulations (such as Exolit® IFR20, also from Hoechst Celanese), phosphine oxide derivatives (such as Cyagard® RF 1204 produced by American Cyanamid), phosphate ester derivatives and elemental red phosphorus (such as Amgard® CPC, produced by Albright and Wilson Americas).

The effectiveness of phosphorus additives as tiaras retardants in organosilicon polymers is based on the absolute loading of the active element, phosphorus, with respect to the total weight of the composition. Compositions with burn flames within the UL94V-1 rating have been obtained using phosphorus additives such as ammonium polyphosphate or phosphine oxides at a loading of from about 3.5% by weight phosphorus to about 7% by weight phosphorus, with the most preferred range being from about 3.5% by weight phosphorus to about 5% by weight phosphorus.

Intumescent flame retardant formulations and formulations containing flame retardant components microencapsulated in nitrogen-containing polymers, such as melamine-formaldehyde resins, show decreased burn flames over the phosphorus flame retardant additives which contain little to no nitrogen other than ammonium ions. A preferred flame retardant additive is Exolit® 462 (available from Hoechst Celanese Corp.). This additive is an ammonium polyphosphate microencapsulated within a melamine formaldehyde wall polymer. Samples with burn flames within the UL94V-1 rating have been obtained using these phosphorus additives at loadings of from about 3% by weight phosphorus to about 7% by weight phosphorus. Samples containing phosphorus flame retardant additives with burn flames within the UL94V-0 rating have been obtained using these additives at a loading of greater than about 10% by weight phosphorus, preferably greater than about 12% by weight phosphorus.

Mother class of flame retardants useful in the present invention comprises halogenated compounds. Preferred are those containing chlorine and bromine.

Chlorine containing flame retardants, such as hexachlorocyclopentadiene derivatives and residues of hexachlorocyclopentadiene, are useful in these organosilicon polymers. Chlorinated flame retardants such as Dechlorane Plus® available from Occidental Chemical Corporation are especially effective in combination with tin synergists. Samples with burn flames in the UL94V-1 range are obtained with combinations of greater than about 17% by weight chlorine together with greater than about 1.0% by weight zinc stannate, $ZnSnO_3$. The preferred range is about 20% by weight chlorine together with about 2.0% by weight zinc stannate, The ratio of chlorine to tin can be varied to obtain optimal burn perforce.

Many brominated flame retardants, even at low levels, interfere with the catalyzed hydrosilation cure reaction to prepare the organosilicon compositions. It has been discovered that minimal interference with the catalyzed cure reaction is observed when these brominated flame retardants are microencapsulated. It has been found that high levels of the additive can be incorporated into the organosilicon prepolymer without adversely affecting the catalyzed hydrosilation cure reaction when the brominated flame retardants are microencapsulated. Examples of these types of additives include but are not limited to the following: brominated alkyls, brominated diphenyl oxides such as decabromodiphenyl oxide, coctabromodiphenyl oxide and higher oligomers of brominated phenyl ethers, for example Saytex® 102, Sayrex® 111 and Saytex® 120 available from Ethyl Corporation and DE-83 from Great Lakes Chemical Corporation. Brominated polystyrene can also be used, such as Pyro Chek® LM or Pyro-Chek® 68PB from Ferro Corporation. Substituted and nonsubstituted brominated bisphenol A additives, such as BE-51 available from Great Lakes Chemical Corporation or Sayrex® RB-100 from Ethyl Corporation, are also useful. My other brominated compound suitable for use as a flame retardant additive which has low solubility in the resin solutions or is able to be microencapsulated can be used in this invention.

The microencapsulation wall or coating material may be comprised of any material typically used to form a protective wall. Suitable encapsulants include: gelatins, waxes, cellulose derivatives, epoxies, acrylates, nylons, urethanes, urea formaldehyde resorcinol rems, and melamine-, urea- and phenol-formaldehyde resins. Additional wall materials can also be used. Any materials which effectively shield a halogenated flame retardant additive from the hydrosilation catalyst, and which do not interfere with the high temperature cure of the organosilicon polymers, are potentially useful in the present invention, Preferred wall materials include urea formaldehyde resorcinol resins and melamine-formaldehyde resins, combinations of these resins with other additives, and polyacrylates. These resins do not interfere with the catalyst effectiveness in the high temperature cure of erganosilicon polymers.

The effectiveness of microencapsulated brominated additives as flame retardants in organosilicon polymers is based on the loading of the active element, bromine, with respect to the total weight of the formulation. The preferred flame retardant additive is Pyro-Chek® 68PBG, a freely ground high molecular weight brominated polystyrene available from Ferro Corporation, Hammond, Indiana, The preferred microencapsulation material for this brominated additive is a urea formaldehyde resorcinol or melamine-formaldehyde, where the wall comprises from about 5% to about 19% by weight of the flame retardant additive. Melamine-formaldehyde is a preferred wall material because it acts as both a wall material and a flame retardant. Urea formaldehyde resorcinol is a more preferred resin because it has the least affect on polymer properties, such as low moisture absorption and low dielectric constant.

In general, microencapsulated flame retardants are present as microscopic particles which generally are substantially spherical in shape, as opposed to fibrous or flake-shaped. These particles generally have a diameter of from about 2 microns to about 150 microns. The particles are comprised of a core of the flame retardant, which core is surrounded by a wall of the encapsulating material. The phrase "wall-to-core" ratio is used to express the ratio of (1) the weight of the "wall" component which surrounds and encapsulates the core of flame retardant agent to (2) weight of the "core" of flame retardant agent. In general, the wall-to-core ratio should be high enough that the flame retardant component therewithin is effectively shielded from the polymerization catalyst. The wall-to-core ratio can be varied over a wide range to minimize interaction between the hydrosilation catalysts and the brominated flame retardant additives, or to maximize active flame retardant payload in the capsules. The wall-to-core ratios for this invention typically range from about 50% by weight wall/50% by weight core, up to 2% by weight wall/95% by weight core. The preferred range is from 20% by weight wall/80% by weight core up to 5% weight wall/95% by weight core. In the case of nitrogen-containing wall materials, such as a melamine-formaldehyde resin, the wall may also impart a measure of flame retardance to the polymers.

It has also been discovered that certain brominated additives having low solubility in the resin or resin solution can be used without microencapsulating them, (Resin soluble halogenated retardants generally must be microencapsulated to prevent inhibition of catalyst activity.) For example, Pyro-Chek® 68PBG can also be used without a coating as a flame retardant for laminates prepared with organosilicon resins. Resin samples containing Pyro-Chek® 68PBG show substantial increases in the gel point of the resin, indicating that the flame retardant does interact with the catalyst. At high temperatures the activity of the resin is increased sufficiently to overcome the catalyst inhibiting effect of the flame retardant additive. Laminate samples can be prepared using various levels of Pyro-Chek® 68PBG as a flame retardant additive if sufficiently high temperatures are used during processing. The low temperature catalyst inhibiting effect provides low temperature storage stability to prepolymers made with this flame retardant.

Samples with burn flames within the UL94V-1 range were obtained when the bromine level in the sample was from about 6% to about 18% by weight, based on the weight of the entire formulation. A preferred range is from about 7% to about 10% by weight bromine. Samples having burn flames within the UL94V-0 range were obtained using a minimum bromine level of from about 18% to about 20% by weight, based on the weight of the organosilicon composition. These ranges can change with the sample thickness and the brominated flame retardant employed.

In addition to obtaining flame retardant polymer formulations using the single flame retardant components, formulations using combinations of flame retardants, such as combinations of both phosphorus and halogen-containing additives (preferably phosphorus containing and microencapsulated bromine containing additives) improve the flame retardant performance of these organosilicon polymers. The phosphorus and bromine flame retardant additives described above can be combined at various loadings and phosphorus-to-halogen ratios to give organosilicon polymer formulations covering a range of flame retardant performance.

Loadings of the phosphorus-containing and bromine-containing flame retardant additives which give desirable flammability performance in organosilicon polymers (i.e. as determined by the UL94V burn test) are as follows. Samples with burn flames within the UL94V-1 rating were obtained using a combination of additives which ranged from about 0.5% by weight phosphorus to about 4% by weight phosphorus, as the bromine content of the polymer was varied inversely from 6% by weight bromine to 1% by weight bromine. Samples with burn flames within the UL94V-0 rating have been obtained using from about 0.5% by weight phosphorus, or greater, as the bromine content of the polymer was varied inversely from at least about 19% by weight bromine to about 9% by weight bromine. Preferred ranges include from about 2.5% to about 5% by weight phosphorus, as the bromine content of the polymer was varied inversely from about 15% to about 11% by weight bromine.

It has been found that the performance of flame retardant agents can be enhanced through the use of "synergists",i.e. substances which, although not recognized as flame retardants, enhance the performance of flame retardant agents present in combination with organosilicon polymers. Synergists have been found to be especially effective when used in combination with halogen-containing flame retardants. The synergist may be any substance which enhances the performance of a flame retardant when present in combination therewith, including the following: antimony oxide, sodium anidmonate, zinc borate, zinc stannate, iron oxide, and titanium dioxide, as well as others.

The synergist may be present in any amount which is effective in enhancing the flame retardancy of the composition. Preferably the synergist is present in amount of from about 0.5 weight percent to about 10 weight percent, based on the weight of the flame retardant present in the composition, Still more preferably, the synergist is present in an amount of from about 0.5 weight percent to about 8 weight percent, based on the weight of the flame retardant present in the composition.

Most preferred for laminate for electronic circuit boards are high molecular weight brominated polystyrenes (such as Pyro-Chek® 68PBG), which is not microencapsulated, because they have minimal effect on electronic and mechanical properties of the organosilicon composition. Most preferred for encapsulants for electronic components is microencapsulated high molecular weight brominated polystyrenes (such as Pyro-Chek® 68PBG encapsulated in urea formaldehyde resorcinol).

Any cyclic polysiloxane or tetrahedral siloxysilane with two or more hydrogen atoms bound to silicon can be used to form the crosslinked organosilicon polymer or hydrosilation crosslinkable organosilicon prepolymer. Cyclic polysiloxanes useful in forming the products of this invention have the general formula:

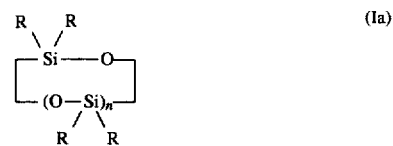

wherein R is hydrogen, a saturated, substituted or unsubstituted alkyl or alkoxy radical, a substituted or unsubstituted aromatic or aryloxy radical, n is an integer from 2 to about 20, and R is hydrogen on at least two of the silicon atoms in the molecule.

Suitable such silicon compounds include those disclose in U.S. Pat. Nos. 4,900,779, 4,902,731, 5,013,809, 5,077,134, 5,008,360, 5,068,303, and 5,025,048, which are incorporated hereto in their entirety by reference thereto. Examples include trilmethylcyclotrisfioxane, tetraoctylcyclotetrasiloxane, and hexamethylcyclotetrasiloxane; tetra- and pentamethycyclotetrssiloxanes; tetra-, penta-, hexa- and heptamethycyclopentasiloxanes; tetra-, penta- and hexamethylcycloexasiloxanes. tetraethylcyclotetrasiloxanes and tetraphenylcyclotetrasiloxanes. Preferred are polysiloxanes comprising 1,3,5,7-tetramethycyclotetrasiloxane, 1,3,5,7.9-pentamethylcyclopentasiloxane and 1,3,5,6,9,11-hexamethylcyclohexasiloxane, or blends thereof.

Preferred cyclic polysiloxanes are the methylhydrocyclosiloxanes. In most cases, what may be used is a mixture of a number of species of these, wherein n can vary widely. Reference to methylhydrocyclosiloxanes herein is intended to refer to such mixtures.

The tetrahedral siloxysilanes are represented by the general structural formula:

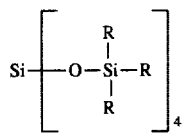

wherein R is as defined above and is hydrogen on at least two of the silicon atoms in the molecule.

Examples of reactants of Formula (Ib) include, e.g., tetrakisdimethylsiloxysilane, tetrakisdiphenylsiloxysilane, and tetrakisdiethylsiloxysilane. Tetrakisdimethylsiloxysilane is the best known and preferred species in this group.

Polymers and prepolymers made with cyclic polysiloxanes or tetrahedral siloxysilanes may also contain other hydrosilation reactable polysiloxanes bearing two or more SiH groups. For instance, they may contain linear, short chain SiH terminated polysiloxanes having the general formula:

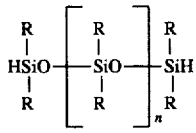

wherein n is 0 to 1000 and R is alkyl or aryl, preferably methyl or phenyl, as described by Leibfried in U.S. Pat. Nos. 5,013,809 and 5,077,134. These linear, short chain SiH terminated polysiloxanes impart flexibility to the cured polymers and can be used to produce elastomers.

The linear poly(organohydrosiloxane) preferably has the general formula:

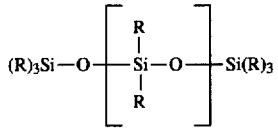

wherein R is a substituted or unsubstituted, saturated alkyl radical or a substituted or unsubstituted phenyl radical, and about 5% to about 50% of the R's are hydrogen and xn is an integer from about 3 to 100, and the maximum value of m is preferably 40.

Exemplary linear poly(organohydrosiloxanes) include: trimethylsiloxy-terminated dimethylsiloxane-methylhydrosiloxane copolymer, dimethylsiloxy-terminated dimethylsiloxane-methylhydrosiloxane copolymer, dimethylsiloxy-terminated polydimethylsfioxane, trimethylsiloxy-terminated methyloctylsiloxane-methylhydro-siloxane copolymer, dimethylsiloxy-terminated phenylmethylsiloxane-methylhydro-siloxane copolymer, trimethylsfioxy-terminated methylcyanopropyl-siloxane-methylhydrosiloxane copolymer, trimethylsiloxy-terminated 3,3,3-trifluoropropyl-methylsiloxane methylhydrosiloxane copolymer, trimethylsiloxy-terminated 3-aminopropylmethyl siloxane-methylhydrosfioxane copolymer, trimethylsiloxy-terminated 2-phenylethylmethylsiloxane-methylhydrosiloxane copolymer, and trimethylsiloxy-terminated 2-(4-methylphenyl)-ethylmethyl-siloxane-methylhydrosiloxane copolymer.

Polycyclic polyene compounds useful in preparing the composition of this invention are polycyclic hydrocarbon compounds having at least two non-aromatic carbon-carbon double bonds that are reactive in hydrosilation. Preferably they are in the rings of the compound. Illustrative are compounds selected from the group consisting of cyclopentadiene oligomers (e.g., dicyclopentadiene, tricyclopentadiene and tetracyclopentadiene), norbornadiene dimer, bicycloheptadiene (i.e., norbornadiene) and its Dieis-Alder oligomers with cyclopentadiene (e.g., dimethanohexahydronaphthalene), and substituted derivatives of any of these, e.g., methyl dicyclopentadienes. Preferred are cyclopentadiene oligomers, such as dicyclopentadiene and tricylopentadiene. Two or more polycyclic polyenes can be used in combination.

Other hydrocarbon compounds may also be used. For instance, according to one embodiment described in U.S. Pat. No. 5,008,360, which is incorporated herein in its entirety by reference, the hydrocarbon component comprises (a) at least one low molecular weight (typically having a molecular weight less than 1,000, preferably less than 500) polyene having at least two non-aromatic carbon-carbon double bonds highly reactive in hydrosilation (they may contain other less reactive (including unreactive) double-bonds, provided that those double bonds do not interfere with the reactivity of the highly reactive double bonds; but, compounds having only two highly reactive double bonds are preferred), the carbon-carbon double bonds being either in an alpha, beta or gamma position on a linear carbon moiety, next to two bridgehead positions in a strained polycyclic aliphatic ring structure, or in a cyclobutene ring, and (b) at least one polycyclic polyene having at least two chemically distinguishable non-aromatic carbon-carbon double bonds in its rings that are reactive in hydrosilation. Examples of component (a) include 5-vinyl-2-norbornene, o-, m- or p-diisopropenylbenzene, o-, m- or p-divinylbenzene, diallyl ether, diallyl benzene, dimethanohexahydronaphthalene and the symmetrical isomer of tricyclopentadiene. By "having at least two chemically distinguishable carbon-carbon double bonds" it is meant that at least two carbon-carbon double bonds have widely different rates of reaction in hydrosilation and that one of the double bonds will react prior to substantial reaction of the other double bond(s). This first double bond must be quite reactive in hydrosilation. Reactive double bonds include those that are next to two bridgehead positions in a strained polycyclic aliphatic ring structure or in a cyclobutene ring, as per component (a) of the embodiment described directly above. The other carbon-carbon double bond(s) may be any other non-aromatic, 1.2-disubstituted non-conjugated carbon-carbon double bond that is not next to two bridgehead positions in a strained polycyclic aliphatic ring structure and is not in a cyclobutene ring. Exemplary are dicyclopentadiene and the asymmetrical isomer of tricyclopentadiene. Preferred, for some applications, when using these hydrocarbon compounds are cyclic polysiloxanes containing three or more SiH groups.

It is also possible to add other groups to the crosslinked structure. For instance, in U.S. patent application No. 07/764,746, now U.S. Pat. No. 5,196,498) (which is hereby incorporated in its entirety by reference), Leibfried teaches incorporating other groups such as short chain alkyl groups into the system by attaching them to SiH bearing compounds (e.g., the cyclic polysiloxanes described above) and reacting them with polycyclic polyenes and silicon containing compounds (e.g., the cyclic polysiloxanes and tetrahedral siloxysilanes described above).

The reactions for forming the organosilicon prepolymers and polymers of this invention are described in U.S. Pat. Nos. 4,900,779, 4,902,731, 5,013,809, 5,077,134, 5,008,360, 5,068,303, 5,025,048, and 4,877,820, and U.S. patent application No. 07/764,746, each of which are incorporated herein in its entirety by reference thereto.

The reactions for forming the prepolymers and polymers can be promoted thermally or by the addition of a hydrosilation catalyst or radical generators such as peroxides and azo compounds. Hydrosilation catalysts include metal salts and complexes of Group VIII elements. The preferred hydrosilation catalysts contain platinum (e.g., bis(acetronitrile)platinum dichloride, bis(benzonitrile)platinum dichloride, platinum on carbon, platinum dichloride, cyclooctadieneplatinum dichloride, dicyclopentadieneplatinum dichloride, chloroplatinic acid, etc.). The preferred catalyst, in terma of both reactivity and cost, is chloroplatinic acid ($H_2PtCl_6 \cdot 6H_2O$), which is preferably complexed with the olefin as described in U.S. Pat. Nos. 4,900,779 and 5,008,360. Catalyst concentrations of 0.0005 to about 0.05% by weight of platinum, based on the weight of the monomers, are preferred.

To prepare the thermoset and thermoplastic polymers, several approaches are available. It is possible, by selection of reactants, reactant concentrations and reaction conditions, to prepare polymers exhibiting a broad range of properties and physical forms. Thus, it has been found possible to prepare tacky solids, elastomeric materials, and tough glassy polymers.

In one approach, the correct relative ratios of reactants and the hydrosilation catalyst are simply mixed and brought to a temperature at which the reaction is initiated and proper temperature conditions are thereafter maintained to drive the reaction to substantial completion (typically, with a ratio of carbon-carbon double bonds to SiH groups of about 1:1, when 70 to 90% of the SiH groups are consumed).

Generally, the ratio of carbon-carbon double bonds in the polycylic polyene compounds to SiH groups m the silicon containing compounds is m the range of about 0.5:1 to about 1.8:1. Thermoset polymers having a crosslinked structure result when the ratio of carbon-carbon double bonds to SiH groups is in the range of from about 0.6:1 up to about 1.3:1, more preferably from about 0.8:1 up to about 1.1:1.

Generally, the ratio of hydrosilation reactive carbon-carbon double bonds in the polycyclic polyene compound and the flame retardant to hydrosilation reactive ≡SiH groups in the silicon containing compound and the flame retardant is in the range of from about 0.5:1 up to about 1.8:1, and the composition comprises the flame retardant in an amount of from about 2 weight percent to about 90 weight percent, based on the overall weight of the composition. Preferably, the ratio of hydrosilation reactive carbon-carbon double bonds in the polycyclic polyene compound and the flame retardant to hydrosilation reactive ≡SiH groups in the silicon containing compound and the flame retardant is in the range of from about 0.6:1 to about 1.3: 1, and the composition comprises the flame retardant in an amount of from about 2 weight percent to about 50 weight percent, based on the weight of the composition. More preferably, the ratio of hydrosilation reactive carbon-carbon double bonds in the polycyclic polyene and the flame retardant to hydrosilation reactive ≡SiH groups in the silicon containing compound and the flame retardant is in the range of from about 0.8:1 to about 1.1:1, and the composition comprises the flame retardant in an amount of from about 3 weight percent to about 35 weight percent, based on the weight of the composition.

When the flame retardant(s) used contains hydrosilation reactive functional groups, these groups should be considered part of the total reactive functionality of the organosilicon composition. The level of hydrosilation reactive carbon-carbon double bonds of the polycyclic polyene compounds or the level of hydrosilation reactive SiH groups in the silicon-containing compounds should be adjusted in view of these reactive groups to give the desired ratio for the composition. (This is true with respect to other such ratios described in this specification.)

B-stage type prepolymers can be prepared as disclosed in U.S. Pat. Nos. 4,877,820, 5,008,360 and 4,902,731, each of which is incorporated herein in its entirety by reference thereto. Generally, the initial product of the reaction at lower temperatures, e.g., about 25 to about 80° C., is a crosslinkable prepolymer, which may be in the form of a solid or a flowable, heat-curable liquid, even though the ratio of carbon-carbon double bonds to SiH groups is otherwise suitable for cross-linking. The prepolymers generally have 30 to 70% of the SiH groups reacted, and when liquids are desired preferably about 30 to 65% of the SiH groups reacted. Such prepolymers, analogous to the so-called B-stage resins encountered in other thermoset preparations, can be recovered and transferred prior to curing.

These prepolymers are prepared using polycyclic polyenes having at least two chemically distinguishable non-aromatic carbon-carbon double bonds in their rings. Illustrative are compounds selected from the group consisting of dicyclopentadiene, asymmetrical tricyclopentadiene, and methyl dicyclopentadiene, and substituted derivatives of any of these. Preferred is dicyclopentadiene. Such prepolymers can also be prepared with the hydrocarbon combinations described in U.S. Pat. No. 5,008,360.

The prepolymers, including the viscous, flowable liquid prepolymers, are stable at room temperature for varying periods of flame, and cure upon reheating to an appropriate temperature, e.g., about 100° to about 250° C. Frequently, additional catalyst is added to the prepolymer prior to cure to further promote the reaction.

A second type of prepolymer can be prepared by a process described in U.S. Pat. Nos. 5,013,809 and 5,077,134. In this process, an olefin rich prepolymer is prepared by reacting a large excess of polycyclic polyene compounds with cyclic siloxanes or tetrahedral siloxysilanes. The olefin rich organosilicon prepolymer is blended with additional cyclic polysiloxane or tetrahedral siloxysilane before cure.

According to this process, organosilicon prepolymers are made with a large excess of carbon-carbon double bonds available for reaction with SiH groups. That is, the ratio of carbon-carbon double bonds in the rings of the polycyclic polyenes used to form the polycyclic polyene residues to SiH groups in the cyclic polysiloxanes and tetrahedral siloxysilanes used to form the cyclic polysiloxane or tetrahedral siloxysilane residues is greater than 1.8:1, preferably greater than 1.8:1 and up to 2.2:1.

The prepolymers of this embodiment are generally in the form of flowable liquids, which are stable at room temperature. The most stable prepolymers are formed at a double bond to SiH ratio of about 2:1 since virtually all SiH is reacted and excess polycyclic polyene need not be removed. (Due to their odor, the presence of unreacted polycyclic polyenes may be undesirable. When necessary or desirable, unreacted polycyclic polyenes can be stripped, e.g., using a rotoevaporator, to form odorless compositions.)

Later, crosslinked polymers are formed by mixing the prepolymers with the polysiloxanes/siloxysilanes such that the total ratio of non-aromatic carbon-carbon double bonds in the rings of the polycyclic polyenes used to form the polycyclic polyene residues (a) to SiH groups in the polysiloxanes and siloxysilanes used to form the polysiloxane/siloxysilane residues (b) is in the ratio of 0.4:1 to 1.7:1; preferably 0.8:1 to 1.3:1, most preferably about 1:1, and curing the mixture in the presence of a hydrosilation catalyst.

Preferably, according to this embodiment, the organosilicon prepolymers are reacted with the polysiloxanes and/or siloxysilanes to form a crosslinked polymer in a mold. The prepolymers and polysiloxanes/siloxysilanes are stored separately and are blended before entering the mold. The hydrosilation catalyst may be present in either or both stream(s) or injected directly into the mixer. The reaction is exothermic and proceeds rapidly so that the polymer gels and the product can be removed from the mold in minutes. The components of the blends are completely stable until they are mixed. Thin permits indefinite ambient storage of the materials.

Alternately, the blend components can be premixed and stirred in a tank. These blends have low viscosity and are pumpable. Addition of catalyst and/or application of heat can be used to cure the prepolymer composition. The reaction may be carried out in an extruder, mold or oven, or the blend may be applied directly on a substrate or part.

With all of the above processes, the reaction speed and its accompanying viscosity increase can be controlled by use of low levels of a cure rate retardant (completing silent), such as N,N,N',N'-tetramethylethylenediamine, diethylenetriamine or phosphorus compounds, such as those described in "Phosphorus Based Catalyst Retardants for Silicon Carbon Resin Systems", Research Disclosure 326103 (June 1991).

Stabilizers (antioxidants) are useful to maintain storage stability of B stage materials and thermal oxidative stability of the final product. Preferred are bis(1,2,6,6-pentamethyl-4-piperidinyl)-(3,5-di-tert-butyl-4-hydroxybenzyl)butylpropanedioate, (available as Tinuvin™ 144 from Ciba-Geigy Corp., Hawthorne, N.Y.) or a combination of octadecyl 3,5-di-tert-butyl-4-hydroxyhydrocinnamate (also known as octadecyl 3-(3',5'-di-tert-butyl-4'-hydroxyphenyl)propionate), available as Naugard® 76 from Uniroyal Chemical Co., Middlebury, Conn., and bis(1,22,6,6-pentamethyl-4-piperirlinylsebacate), available as Tinuvin® 765 from Ciba-Geigy Corp. Stabilizers and their use are described in U.S. Pat. No. 5,025,048 and U.S. patent application No. 593,167, which are incorporated herein by reference.

An elastomer can be added to improve the toughness of the organosilicon polymer-containing compositions of the present invention. Although any elastomer may be added to impart toughness to the organosilicon polymer compositions of the invention, hydrocarbon elastomers are preferred for use in the present invention. Preferred are ethylene-propylene-ethylidenenorbornene polymers having a molecular weight of from about 5500 to about 7000. Most preferred is Trilene 65 elastomer (obtainable from Uniroyal of Middlebury, Conn.). Elastomers are generally used in an amount of from about 0.5 to 20 weight percent, preferably from about 3 to about 12 weight percent, based on the weight of the total composition. Elastomers my be added to the monomers or to a prepolymer. Use of elastomers is described in U.S. patent application Nos. 593,161 (now allows) and 685,360 (now U.S. Pat. No. 5,171,817), each of which is incorporated herein by reference, as well as "Organosilicon Compositions Containing Hydrocarbon Elastomers", Research Disclosure 33082 (October 1991).

The organosilicon composition of this invention have excellent electrical insulating properties and resistance to moisture. Many also have high glass transition temperatures. Best moisture resistant properties are obtained with brominated flame retardants. The phosphorus flame retardants lower the amount of smoke produced during combustion of the organosilicon compositions.

The polymers and prepolymers of this invention are well suited for electronic applications, e.g., composites, adhesives, encapsulants, potting compounds and coatings. They are especially useful for preparing laminates and prepregs, such as those used for printed circuit boards. Such prepregs and laminates are described in U.S. Pat. No. 5,008,360, which is incorporated herein in its entirety by reference thereto.

The article of manufacture of this invention is selected from the group consisting of an electronic component comprising the organosilicon composition or an electronic component coated or encapsulated (potted or sealed) with the organosilicon composition. The component typically comprises at least one member selected from the group consisting of electronic circuit boards, circuit board laminates, circuit beard prepregs, semiconductor devices, capacitors, resistors, diodes, transistors, transformers, coils, wires, hybrid circuits and multichip modules.

The following examples serve to illustrate the invention. They are not intended to be limiting. All percentages and parts are by weight.

Procedures for Examples I–VII and XXIV

Flame retardant additives were incorporated into catalyzed prepolymer solutions with stirring to give well dispersed mixtures. These prepolymer formulations were cured or fabricated into laminates using processing conditions similar to non-flame retarded prepolymers.

Polymer Synthesis

Prepolymer solutions were prepared from the following components.

Catalyst solution A was prepared by adding 100 parts dicyclopentadiene and 0.3 parts chloroplatinic acid to a glass container. The mixture was heated at 70° C. for 1 hour and cooled to room temperature.

Catalyst solution B was prepared by dissolving divinyltetramethyldisiloxane platinum complex (PC072 Huls, America, Bristol, Pa.) in toluene to give a solution which was 0.4 wt % platinum (Example I–III, V–IX, XI, XII and XXV (except Sample 7), and some of the samples in Example IV) or dissolving cyclooctadienepolatinum dichloride (available from Degussa, South Plainfield, N.J.) in methyl ethyl ketone to give a solution which was 0.28 wt % platinum (Examples X, some of the samples in Example IV and Sample 7 in Example XXV).

Reaction solution A was prepared by combining 252.5 parts methylhydrocyclosiloxane, 11.2 parts octadecyl 3,5-di-tert-butyl-4-hydroxyhydrocinnamate (antioxidant) available as Naugard® 76 from Uniroyal Chemical Co., Middlebury, Conn., and 2.3 parts bis(1,2,2,6,6-pentamethyl-4-piperidinylsebacate) (antioxidant) available at Tinuvin® 765 from Ciba-Geigy Corp., Hawthorne, N.Y., and 13.5 parts toluene.

Reaction solution B was prepared by combining 330.3 parts dicyclopentadiene, 3.7 parts catalyst solution A and 116.5 parts toluene.

A rubber solution was prepared by combining 30 parts Trilene® 65 rubber available from Uniroyal Chemical Co., Middlebury, Conn., with 70 parts toluene.

The prepolymer was prepared by heating reaction solution A to 70° C. 15 in a suitable glass reaction vessel. Reaction solution B was added dropwise to solution A with stirring to maintain a reaction temperature of 75°–85° C. The reaction solution was heated at 70° C. for 1 hour after the addition was complete if needed to ensure complete reaction. The prepolymer was activated by adding 3–6 parts catalyst solution B to the prepolymer to give a gel point of nearly 5 minutes at 130° C. (The gel point of the prepolymer formulation was the required for the activated prepolymer formulation to gel or cure on the face of a hot block at a specified temperature. A gel point of nearly five minutes at 130° C.

indicated the prepolymer had sufficient catalyst activity to cure completely to a high Tg polymer.) The rubber solution (105.3 parts) was then added to the prepolymer solution.

Flame retardant additives were incorporated into catalyzed prepolymer solutions with stirring to give well dispersed mixtures.

Prepreg Preparation

The prepregs were prepared by dipping the appropriate glass (7628 glass for 8 layer, 0.0625 inch laminates and 1080 glass for 2 layer, 0.005 inch laminates, style CS256 available from Clark Schwebel, White Plains, N.Y.) in the prepolymer varnish solution containing the appropriate flame retardant additives. These prepregs were cured to a nontacky state by placing them in a forced air oven at 130° C.–165° C. for 30–80% of the gel flame at the prepreg temperature. The appropriate number of prepreg layers were then aligned between the plates of a press and cured at 170° C. for 1 hour at 100 psi pressure to form a laminate. The cured laminates were postcured at 250° C. for 4 hours.

Procedure for UL94V Burn Testing

Burn tests were performed using the Underwriters Laboratories UL94V test procedure, as described in Underwriters Laboratories Inc., Tests for Flammability of Plastic Materials for Parts in Devices and Appliances, UL 94-80 Third Edition, June 1988, which is hereby incorporated, in its entirety, by reference thereto. A Tirrell type burner was used with an inner diameter of 0.5 inches and a tube length of 3.5 inches. Technical grade methane gas was used as recommended in the UL procedure. The gas was passed through a rotameter to get a flow of approximately 0.20 standard liters per minute. The flame height was approximately 0.75 inches. A portable ventless fume hood (Captair, model 5008, available from Captair LabX, Inc., N. Andover, Mass.) was utilized to ensure that the airflow around the sample during burn testing was negligible. The airflow was shut off during burns, but soot and smoke were vented between burns.

The sample was clamped at the top so that the bottom of the sample was approximately 0.5 inches from the burner. The samples of polyorganosilicon resin did not drip upon testing. The flame was applied to the sample for 10 seconds, following which the flame was removed. The flame required for the flaming sample to extinguish was then recorded. When the flaming sample extinguished, the burner flame was reapplied for an additional 10 seconds, and the flame required for the sample to extinguish a second flame was also recorded. This procedure was repeated five flames for the five samples in each set. The sum of all 10 burns (5 samples, 2 burns each) was compared to the rating criteria for burn testing.

EXAMPLE I

This example illustrates the effectiveness of phosphorus-containing flame retardant additives in glass filled laminates. A series of laminate samples were prepared using phosphorus-containing flame retardant additives, all at 3 parts phosphorus. Table I lists the additives, burn flames, and UL ratings for these samples. The symbol N.R. indicates the sample could not be rated by UL94V criteria.

TABLE I

| Sample | Flame Retardant | Burn Time | UL Rating |
|---|---|---|---|
| 1 | None | 226 sec | N.R.[1] |
| 2 | Exolit ® 422[2] | 148 sec | N.R. |
| 3 | Exolit ® 455[2] | 155 sec | N.R. |
| 4 | Amgard ® MCM[3] | 133 sec | V-1 |
| 5 | Cyagard ® RF 1204[4] | 146 sec | N.R. |
| 6 | Exolit ® 462[2] | 115 sec | V-1 |
| 7 | Exolit ® IFR10[2] | 114 sec | V-1 |
| 8 | Amgard ® CPC[3] | 117 sec | V-1 |

[1]N.R. = not rated by UL94V burn test criteria.
[2]Hoechst Celanese Corporation, Charlotte, NC.
[3]Albright & Wilson Americas, Richmond, VA.
[4]American Cyanamid Company, Wayne, NJ.

The data in Table I show the effectiveness of phosphorus as a flame retardant additive. A significant decrease in the burn flame of the laminates containing 3 parts phosphorus was observed compared to the non-flame retarded sample. The flame retardant used in sample 7 was a known intumescent formulation containing a nitrogen blowing agent. The burn flame for this sample was significantly reduced from that observed using untreated ammonium polyphosphate, Sample 2.

EXAMPLE II

This example illustrates the burn performance of 8 layer, 60 laminates prepared with the organosilicon polymers of interest incorporating various levels of phosphorus flame retardants. The phosphorus flame retardant used in this example was Exolit® 462 available from Hoechst Celanese Corp.

TABLE II

| Sample | Phosphorus | Burn Time | UL Rating |
|---|---|---|---|
| 1 | 3 parts | 115 sec | V-1 |
| 2 | 8 parts | 103 sec | V-1 |
| 3 | 10 parts | 61 sec | V-1 |
| 4 | 12 parts | 27 sec | V-0 |

The results show that phosphorus flame retardants can be incorporated to give formulations with UL94V-1 and V-0 ratings depending on the loading of phosphorus.

EXAMPLE III

This example illustrates the effect of brominated additives on the cure kinetics, and the advantage of microencapsulating these brominated additives. The additives were combined with the catalyzed prepolymer solutions and mixed well. The gel point of the resin at a given temperature was taken as a measure of the catalyst activity at this cure temperature.

TABLE III

| Sam. | Br Additive | Br | GP 130° C. | GP 150° C. | GP 170° C. |
|---|---|---|---|---|---|
| 1 | none | — | 5'45" | 1'50" | 0'50" |
| 2 | Pentabromotoluene[1] | 1 part | >10' | >10' | >10' |
| 3 | Saytex ® 102[2] Decabromodiphenylether | 1 part | >10' | >10' | >10' |

TABLE III-continued

| Sam. | Br Additive | Br | GP 130° C. | GP 150° C. | GP 170° C. |
|---|---|---|---|---|---|
| 4 | Pyro-Chek ® 68PBG[3] Brominated polystyrene | 5 parts | >10' | 8'30" | 1'45" |
| 5 | Pyro-Chek ® 68PBG[3] Brominated polystyrene | 15 parts | >10' | >10' | 4'20" |
| 6 | Pyro-Chek ® 68PBG[3] microencapsulated | 15 parts | 6'05" | 2'35" | 0'45" |

[1]Ameribrom, Incorporated, New York, NY.
[2]Ethyl Corporation, Baton Rouge, LA.
[3]Ferro Corporation, Hammond, IN.

Samples 2 and 3, prepared with low levels of non-encapsulated brominated additives, showed gel flames of greater than 10 minutes at all temperatures tested. Samples 4 and 5, prepared with Pyro-Chek 68PBG, a high molecular weight brominated polystyrene of low solubility in the resin, retained a gel point at high temperatures. These gel points were substantially longer than the plain resin. Sample 6 was microencapsulated in a urea formaldehyde resorcinol based wall polymer at a loading of 19% by weight wall, 81% by weight core. The samples containing microencapsulated brominated flame retardants showed minimal degradation of the prepolymer gel point even at the high loadings required to meet the UL94V-0 criteria.

These results indicate that when the brominated flame retardant additives were microencapsulated there was little or no deleterious interaction between the catalyst and the flame retardants.

EXAMPLE IV

This example illustrates the effectiveness of microencapsulated brominated additives as flame retardants in glass filled 8 layer, 0.060 inch laminates prepared with the organosilicon polymer described above. The flame retardant (Pryo-Chek® 68PBG obtained from Ferro Corporation, Hammond, Ind.) was microencapsulated in various wall polymers of different core to wall ratios. Two of the samples were prepared using Pyro-Chek 68 PBG, which had not been microencapsulated, using a cure temperature of 160°–165° C.

TABLE IV

| Sample | BR Level | Wall Material | Wall Level | Burn Time | UL Rating |
|---|---|---|---|---|---|
| 1 | 0 parts | — | — | 226 sec | N.R. |
| 2 | 20 parts | 1 | 19% | 32 sec | V-0 |
| 3 | 20 parts | 1 | 10% | 48 sec | V-0 |
| 4 | 20 parts | 1 | 5% | 52 sec | V-1 |
| 5 | 7 parts | 1 | 19% | 119 sec | V-1 |
| 6 | 20 parts | 2 | 19% | 24 sec | V-0 |
| 7 | 7 parts | 2 | 19% | 93 sec | V-1 |
| 8 | 7 parts | 3 | 0% | 135 sec | V-1 |
| 9 | 20 parts | 3 | 0% | 35 sec | V-0 |

Microencapsulated Wall Polymers:
1 - urea formaldehyde resorcinol
2 - melamine formaldehyde
3 - no capsule, prepreg cured at 160-165° C.

These results show that microencapsulated brommated flame retardant additives are effective in producing formulations with UL94V-1 and V-0 formulations, depending on loading. The capsule wall thickness was not critical as long as the core was effectively shielded from the catalyst. Pyro-Chek® 68 PBG which had not been microencapsulated also was an effective flame retardant additive. It can be incorporated into organosilicon compositions when higher cure temperatures are employed.

EXAMPLE V

This example illustrates the effectiveness of synergists with brominated flame retardant additives. Antimony oxide was added to organosilicon compositions containing brominated flame retardants and 60 mil thick glass filled laminated were prepared from the organosilicon composition.

TABLE V

| Sample | Br[1] | % $Sb_2O_3$[2] | Burn Time | UL Rating |
|---|---|---|---|---|
| 1 | 0 parts | 0 parts | 226 sec | N.R. |
| 2 | 15 parts | 0 parts | 83 sec | V-1 |
| 3 | 15 parts | 3.7 parts | 82 sec | V-1 |
| 4 | 15 parts | 7.5 parts | 36 sec | V-0 |

[1]As Pyro-Chek ® 68 PBG, Ferro Corporation, Hammond, IN, microencapsulated with urea formaldehyde resorcinol polymer, 19 parts wall, 81 parts core.
[2]From ASARCO Incorporated, New York, NY.

Antimony oxide was found to be a synergist with brominated flame retardants in these organosilicon polymers. Other metal oxides behave similarly.

EXAMPLE VI

This example illustrates the effectiveness of combinations of phosphorus and bromine containing flame retardant additives in 8 layer, 60 roll thick glass filled laminates. The brominated flame retardant, Pyro-Chek 68PBG (obtained from FezTo Corporation), was microencapsulated with a urea formaldehyde resorcinol based polymer 19% by weight wall, 8 1% by weight core. The phosphorus flame retardant was ExoLit®422 from Hoechst Celanese Corporation, Charlotte, N.C.

TABLE VI

| Sample | P (parts) | Br (parts) | Burn Time | UL Rating |
|---|---|---|---|---|
| 1 | 0 | 0 | 226 sec | N.R. |
| 2 | 1.25 | 3.75 | 123 sec | V-1 |
| 3 | 5 | 11 | 23 sec | V-0 |
| 4 | 2.5 | 15 | 26 sec | V-0 |

A variety of UL94V-1 and V-0 formulations were obtained by changing the ratio of phosphorus to bromine in the samples as well as the total flame retardant loading.

EXAMPLE VII

This example illustrates the effectiveness of various flame retardant additives in thin laminates (2 roll or 5 mi thick laminates prepared with 1080 or 2313 glass, style CS256

Clark Schwebel, White Plains, N.Y.). The flame retardant additive used was Pyro-Chek® 68 PBG. The encapsulation wall polymer was present as 19% by weight of the brominated flame retardant additive. The symbol N.R. indicates the sample could not be rated by UL94V burn test criteria.

TABLE VII

| Sample | Laminate Thickness | Bromine | Wall Material | UL Rating |
|---|---|---|---|---|
| 1 | 5 mils | 20 parts | 1 | N.R. |
| 2 | " | 7 parts | 1 | N.R. |
| 3 | " | 20 parts | 2 | V-0 |
| 4 | " | 7 parts | 2 | N.R. |
| 5 | " | 20 parts | 3 | V-0 |
| 6 | " | 7 parts | 3 | N.R. |
| 7 | 2 mils | 20 parts | 1 | V-0 |

Microencapsulated Wall Polymer
1 - no wall, cure temperature 160–165° C.
2 - urea formaldehyde resorcinol (19 parts wall, 81 parts core)
3 - melamine formaldehyde (19 parts wall, 81 parts core)

The results from this example showed the additives described impart sufficient flame retardancy to meet UL94V-0 criteria on thin laminate samples prepared with the organosilicon polymers described.

EXAMPLE VIII

This example illustrates the use of chlorinated flame retardants in 8 layer, 60 mil laminates prepared from the organosilicon compositions. The chlorine containing flame retardant additive used in this example was Dechlorane Plush®, Occidental Chemical Corporation, Niagara Falls, N.Y.

TABLE VIII

| Sample | Chlorine | $ZnSnO_3$ | Burn Time |
|---|---|---|---|
| 1 | 0 parts | 0 parts | 226 sec |
| 2 | 15 parts | 0 parts | 231 sec |
| 3 | 15 parts | 2 parts | 168 sec |

Chlorinated flame retardant additives were found to be most effective in combination with zinc stannate synergist, obtained from the International Tin Research Institute, Uxbridge, England.

EXAMPLE IX

This example illustrates the effect of cyclic phosphazenes as flame retardant additives in 60 rail laminate samples prepared from the organosilicon composition as described above.

TABLE IX

| Sample | Phosphazene[1] | Phosphorus | Burn Time | UL Rating |
|---|---|---|---|---|
| 1 | 16.7 parts | 1.7 parts | 73 sec | V-1 |
| 2 | 9.1 parts | 1.0 part | 110 sec | V-1 |
| 3 | 13.5 parts[2] | 1.5 parts | 70 sec | V-1 |

[1]Trimmer Oil, Ethyl Corporation, Baton Rouge, LA.
[2]Sample also contains 8 parts Pentaerythritol, Aldrich Chemical Company, Milwaukee, WI and 11 parts Pyro-Chek® 68 PBG, Ferro Corporation, Hammond, IN microencapsulated in urea formaldehyde resorcinol, 19 parts wall, 81 parts core.

EXAMPLE X

This example illustrates the burn performance of samples of the organosilicon composition described above. These samples contain no added filler material. The burn flame is the flame required for a 2.5 inch by 0.5 inch by 0.125 inch bar to extinguish after applying a methane flame to the sample for 10 sec.

TABLE X

| Sample | Flame Retardant | Parts Additive | Burn Time |
|---|---|---|---|
| 1 | none | 0 parts | 61 seconds |
| 2 | Pyro-Chek 68 PBG | 29.2 parts | 2 seconds |

The sample containing the brominated flame retardant additive would be expected to meet UL94V-0 burn test criteria.

EXAMPLE XI

This example illustrates the burn performance of the organosilicon polymer described above in the presence of a particulate filler material. Samples were prepared as follows. The solvent free prepolymer was formulated to give a mixture with 65–80 parts fused silica, 0.02 parts methacryloxypropyltrimethoxysilane coupling agent (A174, Union Carbide Danbury, Conn.), 0.4 parts carbon black (Lampblack 101, Degussa, Frankfurt, Germany) and 34.4 to 19.4 parts organosilicon prepolymer. The formulation was mitered and the flame retardant was added at 5 to 10 weight percent based on the total formulation (this decreased the effective percentage of filler). After mixing, the formulation was placed in a flask and degassed in a rotary evaporator for 10–15 min at 70° C. The warm mixture was transferred to a preheated mold, 100° C., and cured in an oven for 3 hr at 180° C. The burn flames for filled systems containing various flame retardant additives are given below.

TABLE XI

| Sample | Flame Retardant | % Filler | % Flame Retardant | Burn Time | UL Rating |
|---|---|---|---|---|---|
| 1 | none | 65 | 0 | burned completely | — |
| 2 | Pyro-Chek® 68 PBG[1] | 62 | 5 | 111 sec | V-1 |
| 3 | Exolit® 462[2] | 62 | 5 | 79 sec | V-1 |
| 4 | Exolit® 455[2] | 62 | 5 | 35 sec | V-0 |
| 5 | Pyro-Chek® 68 PBG[1] | 54 | 10 | 19 sec | V-0 |
| 6 | Exolit® 422[2] | 54 | 10 | 13 sec | V-0 |
| 7 | Exolit® 422[2]/ Pyro-Chek 68 PBG[1] | 54 | 10 | 10 sec | V-0 |
| 8 | Exolit® 455 | 54 | 10 | 6 sec | V-0 |

[1]Available from Ferro Corporation, Hammond IN. Microencapsulated with urea formaldehyde resorcinol polymer, 19% wall.
[2]Available from Hoechst Celanese Corporation, Charlotte, NC.

This example illustrates a variety of additives as well as combinations of additives were effective flame retardants for the organosilicon formulations described above in the presence of particulate fillers.

EXAMPLE XII

The following example illustrates the effect of increased filler loadings on the burn performance of the organosilicon polymer in the presence of flame retardant. The flame retardant was Pyro-Chek® 68 PBG available from Ferro Corporation, Hammond, Ind., which was microencapsulated in a urea formaldehyde resorcinol wall polymer with a wall level shown in the table.

TABLE XII

| Sample | % Filler | % Flame Retardant | Wall Level | Burn Time | UL Rating |
|---|---|---|---|---|---|
| 1 | 60 wt % | 8 wt % | 5 wt % | 72 sec | V-1 |
| 2 | 60 wt % | 8 wt % | 19 wt % | 85 sec | V-1 |
| 3 | 64 wt % | 8 wt % | 5 Wt% | 41 sec | V-0 |
| 4 | 69 wt % | 8 wt % | 5 wt % | 33 sec | V-0 |
| 5 | 80 wt % | 5 wt % | 5 wt % | 28 sec | V-0 |

The burn flame of filled polymer samples containing the same level of flame retardant decreased with increasing percentage of nonflammable filler incorporated into the formulation.

EXAMPLE XIII

Preparation of Hexachlorocyclophosphazene Mixture

Ammonia and hydrochloric acid were bubbled into 1 liter of dry chlorobenzene (0.24 1/min, 4 hr) to form an ammonium chloride slurry. Chlorine was bubbled into a chlorobenzene solution of phosphorus trichloride (278.4 g, 2.05 tool) to form a phosphorus pentachloride solution. The phosphorus pentachloride solution was added dropwise to the ammonitun chloride slurry while heating and stirring at 210°–220° C. over a period of 155 minutes, Hydrochloric acid and chlorobenzene were distilled from the reactor during the addition. Chlorobenzene was distilled out at approximately the same rate that the phosphorus pentachloride was added. The host reaction mixture was filtered (1080 ml removed) and the chlorobenzene solvent was stripped (1 mm Hg) to give 232.40 grams of yellow oil which solidified to a white solid. Phosphorus-31 NMR analysis showed the product was 74% hexachlorocyclotriphosphazene, 6% octaachlorocyclotetraphosphazene, and 17% higher cyclic phosphazenes.

EXAMPLE XIV

Preparation of the Eugenoxyphenoxycyclophosphazene Intermediate

Phenol (116.8 g) in 1400 ml dry THF was added gradually (1 hour) to a suspension of 24.0 g sodium metal in 100 ml dry THF under nitrogen. The resulting suspension was refluxed for 8 hours under nitrogen. The solution above was added to a slurry of 119 g chlorocyclophosphazenes (as in Example XIII) in 370 ml dry THF at −70° C. under nitrogen over a 12 hour period. The resulting phenoxychlorophosphazene slurry warmed slowly to room temperature.

A solution of 254 g eugenol in 2 liters dry THF was added to a suspension of 23.8 g sodium metal in dry THF under nitrogen over a period of 1.5 hr. The resulting suspension was refluxed under nitrogen for two hours until the sodium was consumed. The resulting brown sodium eugenoxide solution was cooled to room temperature.

The sodium eugenoxide solution was added to the phenoxychlorophosphazene slurry over a two hour period under nitrogen. The resulting suspension was refluxed under nitrogen for 24 hours. Solvent (1.5 liter) was removed by distillation, and the viscous residue was dissolved in 1 liter toluene and washed with 400 m water, 200 ml 2N NaOH, 3×200 ml brine. The toluene solution was then dried over sodium sulfate. After filtering the $Na_2SO_4$, the solution was concentrated by distillation (−400 ml) and vacuum distillation to give a viscous mixture of eugenoxyphenoxycyclophosphazenes The mixture was distilled in a wiped film evaporator (100° C., 0.75 mmHg) to give trieugenoxytriphenoxycyclophosphazene. Triallylphenoxytriphenoxycyclophosphazene is made by a similar procedure where the eugenol from above is replaced by allylphenol.

EXAMPLE XV

Preparation of Phenoxyallylphenoxycyclophosphazene Intermediate

A solution (0.025 tool) of sodium allylphenoxide was prepared by a method similar to the sodium phenoxide procedure above. The THF solution of sodium allylphenoxide was added to diphenoxytetrachlorocyclophosphazene prepared as above (Example XIV). The mixture in THF was refluxed under nitrogen overnight, then concentrated by distillation (−2.25 1 THF). Two liters of toluene were added and the resulting solution was washed with 1 liter water, 1 liter 2N NaOH, 3×1 liter brine. The solution was stripped at atmospheric pressure then under vacuum. The resulting product was distilled in a wiped film evaporator (100° C./<1 mmHg) to give tetra-o-allylphenoxydiphenoxy-cyclophosphazene.

EXAMPLE XVI

Fire Retardant Elastomer

Chloroplatinic acid in isopropanol (0.02 ml of 0.0796M solution in CPA) was injected into an atmosphere of nitrogen in a capped dry polymerization tube. The melted trieugenoxytriphenoxycyclophosphazene mixture of Example XIV (2.50 g) was injected into the polymerization tube, and the resulting solution stirred at 72° C. for 1 hour. A solution of hydrosilane terminated polydimethylsiloxane, Petrarch Systems, Piscataway, N.J., PS537, (1.66 g) in methylene chloride (1 ml) was injected into the polymerization tube. After thirty seconds of stirring at 72° C., the mixture exothermed to 89° C. and a brown elastomer was formed. The elastomer would not dissolve in chloroform, dimethylsulfoxide, or acetone, indicating complete gel formation. After curing at 150° C. for 1 hour and 200° C. for 1 hours, the glass transition temperature as measured by differential scanning calorimetry of the elastomer was −23.8° C. By thermogravimetric analysis. weight loss of the polymer in air started at 400° C. (10% weight loss) and 31.9% of the polymer was retained at 1000° C. A piece of the polymer barely ignited after ten seconds exposure to a butane flame and extinguished immediately upon removal of the flame.

EXAMPLE XVII

Low Tg Elastomer

Chloroplatinic acid (0.0020 g) was weighed into a dry polymerization tube containing a magnetic stirring bar in a nitrogen flushed glove bag. The tube was sealed with a septum cap. Trieugenoxytriphenoxycyclophosphazene mixture of Example XIV (3.20 g) was heated to 50° C. and injected into the tube using a hypodermic syringe. The mixture was stirred for 1 hour at 50° C. Methylhydro-(50–55%)-phenylmethylsiloxane copolymer (Petrarch Systems, Piscataway, N.J. cat. no. PS129.5) (7.14 g) was heated to 50° C. and injected into the tube. The tube was shaken by hand until a solution formed and then stirring at 50° C. was continued until an elastomer was formed. The elastomer had a low glass transition temperature (−58° C.) determined by differential scanning calorimetry. The polymer was thermally stable in air having a 10% weight loss at 410° C. and a weight retention of 45.5% at 1000° C. After curing at 130°

C., 17 hours; 160° C. 6 hours; and 180° C. 16 hours, the sample lost only 5 weight percent. Further curing at 200° C., 2 hours; 225° C., 2 hours; and 280° C., 16 hours, gave a weight loss of 8%. The glass transition temperature had increased to −40° C. but the 10% weight loss in air was up to 460° C.

EXAMPLE XVIII

Fire Retardant Polarmet

Chloroplatinic acid (0.0030 g) was weighed into a dry 8 oz. glass bottle containing a magnetic stirring bar and tetra-o-alloxydiphenoxycyclophosphazene of Example XV (5.17 g). The bottle was sealed with a septum cap. The bottle was flushed with dry nitrogen and 20 ml methylene chloride (dried over molecular sieves) was injected. The resulting solution was stirred at room temperature for a few minutes under a dry nitrogen purge. Methylhydrocyclosiloxane (Petrarch Systems Cat. No. M8830) (4.36 g) was injected into the bottle. The next day 0.5 ml of an isopropanol solution of chloroplatinic acid (adding 0.0050 g CPA) was injected and the bottle was heated in a water bath (bath temperature 50.5° C. to 74.5° C., with 74 minutes heating flame). The methylene chloride was stripped on a rotary evaporator at 40° C., and the viscous polymer was poured into a mold. The mold was heated at 150° C., 8 hours and 250° C., 2 hours to give tough polymer samples (⅛ inches×½ inches×3 inches). The cured polymer had a glass transition temperature at 75° C. by mechanical analysis (rheometrics). The sample was immediately serf extinguished after two 10 second temperature exposures to the flame of a propane torch.

EXAMPLE XIX

Fire Retardant Organosilicon Compositions

Chloroplatinic acid (0.0460 g) was weighed into a dry pop bottle in a nitrogen filled glove bag. The bottle was sealed with a septum cap. Dicyclopentadiene (98.5 g) was injected into the bottle, and the contents stirred with a magnetic stirrer at 50°–55° C. for 1 hour. Methylhydrocyclosiloxane (Petrarch Systems Cat. No. M8830) (120.25 g) was injected into the bottle. The contents were stirred in an 18° C. water bath. The reaction produced an exotherm heating the contents of the reaction vessel to 43.6° C. After approximately five hours of stirring, the norbornene double bone was completely reacted by hydrosilation. The reaction product from the previous paragraph (80.0 g) was weighed into an 8 oz. pop bottle with triollylphenoxytriphenoxycyclophosphazene which was prepared by procedures similar to Example XIV. The contents of the sealed pop bottle were stirred for 20 minutes, and the temperature had risen to 56° C. The temperatures of the reaction was raised to 60° C. using a hot water bath. The material was withdrawn from the bottle using a hypodermic syringe and injected into a glass filled 5 inch×5 inch×⅛ inch mold. The mold was placed into a vacuum oven which was evacuate to degas the material and then cured at 150° C. for 4 hours under nitrogen. The specimens were removed from the mold and cured at 150° C., 2 hours; 225° C., 2 hours; and 285° C., 6 hours under nitrogen. The glass filled specimen showed good wetting of the glass since the cured specimen was semi-translucent. The untilled polymer (3 inches×½ inch×⅛ inch) was subjected to a vertical burning test by touching a propane torch flame to the bottom of the specimen for 10 seconds. After removing the flame, the polymer self-extinguished in 5 seconds. The glass filled specimen extinguished in 8 seconds. The fully cured unfilled polymer had a glass transition temperature of 180° C. and the glass filled polymer had a glass transition at 155° C. The flexural strength of the glass filled polymer (61 parts glass cloth) was 34,000 psi and the flexural modules was $2.4 \times 10^6$ psi.

EXAMPLE XX

Atomic Oxygen Resistance; Organosilicon Compositions as Films and Coatings

The methylhydrocyclosiloxane and dicyclopentadiene reaction product from Example XIX (80 g) was charged with triallylphenoxytriphenoxycyclophaophazene from Example XIV (20 g) into an 8 oz. pep bottle along with a magnetic stirring bar. The bottle contents were stirred and heated to 48° C. After 5 minutes, the reaction mixture exothermed to 95° C. and became viscous. A portion of the reaction product above was cast onto a glass plate and cured at 200° C. for 30 minutes. A hard, glossy transparent coating was formed. The adhesion to glass was strong enough to pull glass off the surface of the plate when the coating was chipped off. A film was cast on a teflon coated aluminum plate and cured for 10 minutes at 200° C. The flexible thin film was peeled from the plate and exposed to atomic oxygen in a plasma for 8 hours. The film from the organosiloxanephosphazene polymer lost 0.14 weight percent, while Kapton® polyamide film, Dupont. Wilmington, DE lost 78 weight percent during the 8 hour exposure to atomic oxygen.

EXAMPLE XXI

Fire Retardant Organosilicon Foams

Dimethanohexahydronaphthalene (5.53 ), tetraallylphenoxydiphenoxycyclophosphazene (Example XV) (6.4 g), and chloroplatinic acid solution in isopropanol (0.38 ml of 200 ppm CPA solution) were charged to a 100 ml round bottom flask and stirred at 50° C. for 30 minutes. Then ethylene glycol (0.16 g) was added, and after 1 minute a linear polymethylhydrosiloxane (Petrarch Systems PS119) (6.6 g) was added. Within nearly six minutes, the reaction exotherm peaked at 198° C. The flexible foam was cured at 150° C. for 16 hours under nitrogen to produce a hard foam. This foam was exposed to the flame of a propane torch for 10 seconds. The foam self extinguished within 2 seconds. A second flame exposure for 10 seconds self extinguished within 8 seconds. A tough black char formed that appears to be non-flammable.

EXAMPLE XXII

The methylhydrocyclosiloxane/dicyclopentadiene reaction product from Example XIX (7.2 g) was reacted with tris(trifluoroethoxy)triallyloxycyclophosphazene in a sealed polymerization tube at 21°–94° C. At 59° C. the reaction exothermed to 93° C. The hard solid polymer was cured at 200° C. for 50 minutes. The resulting polymer extinguished in 1 second and 3 seconds after consecutive 10-second exposures to a propane torch.

EXAMPLE XXIII

Smoke Density of Organosiloxane Compositions Containing Phosphorus Flame Retardant Additives The following examples illustrate the low smoke characteristics of glass reinforced organosilicon compositions described above in the presence of phosphorus flame retardant additives. Smoke density measurements were made using the ASTM E662 Smoke Density Test and were performed by United States Testing Company Incorporated, Fairfield, N.J. Test results reported below are for flaming samples.

TABLE XIII

| Sample | Max. Optical Density (DM) | Optical Density 1.5 min | Density 4.0 min | Time to 90% DM |
|---|---|---|---|---|
| Organosilicon Composition no additive | 156 | 1 | 3 | 12.6 min |
| Organosilicon Composition w/ 12% Amgard MC[1] | 82 | 1 | 2 | 16.5 min |
| FR4 Epoxy Laminate | 469 | 259 | 473 | 2.9 min |

[1]Albright & Wilson Americas, Richmond, VA.

These results show that the smoke density of the organosilicon compositions described above is decreased and the flame to 90% of the maximum smoke density is increased if phosphorus containing flame retardants are used in the formulation. The smoke generated on burning for these organosilicon formulations is substantially lower than for a typical flame retardant epoxy resin.

EXAMPLE XXIV

The following example serves to illustrate the effect of various flame retardant additives on the moisture absorption and electrical properties of 60 rail thick laminate samples prepared with the organosilicon prepolymer as described above. Moisture absorption was measured as follows. A 2 inch by 2 inch piece of laminate was dried under vacuum at 100° C. for nearly one hour and weighed immediately on removing from the oven. The samples were then placed in a constant humidity chamber (85° C., 85% relative humidity) for 7 days. The weight difference of the samples was recorded immediately on removal from the constant humidity chamber. The moisture absorption is reported as the percentage weight increase. The dielectric constant and dissipation factor were measured using ASTM method D-150. Flame retardant loadings are reported as the percentage of the active flame retardant element in the polymer composition.

TABLE XIV

| Sample | Flame Retardant | Flame Retardant Loading | Moisture Absorption | Dielectric Constant | Dissipation Factor | UL Rate |
|---|---|---|---|---|---|---|
| 1 | None | 0% | 0.05 wt % | 3.60 | 0.00171 | N.R. |
| 2 | A | 3% | 0.25 wt % | 3.91 | 0.01355 | V-1 |
| 3 | B | 3% | 0.20 wt % | — | — | V-1 |
| 4 | B | 12% | 0.92 wt % | — | — | V-0 |
| 5 | C | 5%-P 11%-BR | 0.48 wt % | 4.09 | 0.00989 | V-0 |
| 6 | D | 20% | 0.25 wt % | 3.83 | 0.00324 | V-0 |
| 7 | E | 20% | 0.20 wt % | 3.95 | 0.00172 | V-0 |

Flame Retardant Additives:
A Exolit ® 422 from Hoechst Celanese, Charlotte, NC
B Exolit ® 462 from Hoechst Celanese, Charlotte, NC
C Exolit ® 422 from Hoechst Celanese, Charlotte, NC with Pyro-Chek ® 68PBG from Ferro Corporation, Hammond, IN microencapsulated with 19% urea formaldehyde resorcionl.
D Pycro-Chek ® 68PBG from Ferro Corporation, Hammond, IN microencapsulated with 19% urea formaldehyde resorcinol.
E Pyro-Chek 68PBG from Ferro Corporation, Hammond, IN This example shows the flame retardant compounds which alter the moisture absorption and the electrical properties of the organosilicon polymer the least are brominated compounds and microencapsulated brominated compounds having a urea formaldehyde resorcional wall.

While the invention has been described with respect to specific embodiments, it should be understood that they are not intended to be limiting and that many variations and modifications are possible without departing from the scope of this invention.

What is claimed is:

1. An article of manufacture comprising a cured crosslinked organosilicon polymer wherein the article of manufacture is selected from the group consisting of an electronic component which comprises, or an electronic component coated or encapsulated with, the crosslinked organosilicon polymer and the crosslinked organosilicon polymer comprises residues of at least one silicon-containing compound and at least one polycyclic polyene compound linked through carbon to silicon bonds, wherein the silicon-containing compound comprises at least one member selected from the group consisting of:

A. cyclic polysiloxane compounds containing at least two hydrosilation reactive ≡SiH groups;
B. tetrahedral siloxysilane compounds containing at least two hydrosilation reactive ≡SiH groups; and
C. linear poly(organohydrosiloxane) polymers containing at least two hydrosilation reactive ≡SiH groups;

wherein the polycyclic polyene compound contains at least two hydrosilation reactive carbon-carbon double bonds;

wherein at least a substantial portion of at least one member selected from the group consisting of the silicon compound and the polycyclic polyene compound has more than two reactive sites; and wherein the composition further comprises at least one halogen containing flame retardant.

2. An article of manufacture as described in claim 1, wherein the flame retardant comprises at least one.

3. An article of manufacture as described in claim 1, wherein the flame retardant comprises at least one halogen containing component which resides in the polymer.

4. An article of manufacture as described in claim 1, wherein the flame retardant comprises at least one bromine containing residue.

5. An article of manufacture as described in claim 1, wherein the flame retardant comprises at least one bromine containing component which resides in the polymer.

6. An article of manufacture as described in claim 1, wherein the flame retardant comprises at least one.

7. An article of manufacture as described in claim 1, wherein the flame retardant comprises at least one chlorine containing component which resides in the polymer.

8. An article of manufacture as claimed in claim 1 wherein the article of manufacture exhibits flammability characteristics which meet the criteria for the UL94 V-1 rating according to Underwriters Laboratories Tests for Flammability of Plastic Materials UL94 Vertical Burn Test.

9. An article of manufacture as described in claim 8, wherein the organosilicon composition contains at least one flame retardant.

10. An article of manufacture as claimed in claim 9, wherein the flame retardant comprises at least one member selected from the group consisting of brominated diphenyl oxides, brominated polystyrenes, brominated bisphenol A's, hexachlorocyclopentadiene derivatives and hexachlorocyclopentadiene derivatives.

11. An article of manufacture as described in claim 8 wherein the polycyclic polyene compound contains two 12. An article as claimed in claim 11, wherein the polycyclic polyene compound contains at least two chemically distinguishable carbon-carbon double bonds in its rings.

13. An article of manufacture as described in claim 8 wherein the polycyclic polyene is selected from the group consisting of dicyclopentadiene, tricyclopentadiene, norbornadiene flamer, bicycloheptadiene, dimethanohexahydronaphthalene, and methyl dicyclopentadiene, and the silicon containing compound is a cyclic polysiloxane.

14. An article as claimed in claim 9 as described wherein the flame retardant comprises a microencapsulated bromine containing flame retardant.

15. An article as described in claim 14, wherein the flame retardant is microencapsulated in at least one member selected from the group consisting of gelatins, waxes, cellulose derivatives, epoxies, acrylates, nylons, urethanes, urea formaldehyde resorcinol resins, and melamine-, urea- and phenol- formaldehyde resins.

16. An article as described in claim 15, wherein the flame retardant comprises at least one member selected from the group consisting of brominated alkyls, brominated diphenyl oxides, brominated polystyrenes, brominated hisphenol A's.

17. An article as described in claim 16, wherein the composition further comprises a flame retardant synergist comprising a metal oxide.

18. An article as described in claim 17, wherein the flame retardant synergist comprises at least one member selected from the group consisting of antimony oxide, sodium antimonate, zinc borate, zinc stannate, iron oxide, and titanium dioxide, and wherein the synergist is present in an amount of from about 0.5 weight percent to about 8 weight percent based on the weight of the flame retardant.

19. An article as described in claim 9 wherein the ratio of hydrosilation reactive carbon-carbon double bonds in the polycyclic polyene compound and the flame retardant to hydrosilation reactive ≡SiH groups in the silicon containing compound and the flame retardant is in the range of from about 0.5:1 up to about 1.8:1, and the composition comprises the flame retardant in an amount of from about 2 weight percent to about 90 weight percent, based on the overall weight of the composition.

20. An article as described in claim 9 wherein the ratio of hydrosilation reactive carbon-carbon double bonds in the polycyclic polyene compound and the flame retardant to hydrosilation reactive ≡SiH groups in the silicon containing compound and the flame retardant is in the range of from about 0.6:1 to about 1.3:1, and the composition comprises the flame retardant in an amount of from about 2 weight percent to about 50 weight percent, based on the weight of the composition.

21. An article as described in claim 9 wherein the ratio of hydrosilation reactive carbon-carbon double bonds in the polycyclic polyene and the flame retardant to hydrosilation reactive ≡SiH groups in the silicon containing compound and the flame retardant is in the range of from about 0.8:1 to about 1.1:1, and the composition comprises the flame retardant in an amount of from about 3 weight percent to about 35 weight percent, based on the weight of the composition.

22. An article as described in claim 8, wherein the polymer comprises up to 90%, by weight of the polymer, of at least one filler.

23. An article as claimed in claim 22, wherein the filler is selected from the group consisting of carbon black, vermiculite, mica, wollastonite, calcium carbonate, silica, fused silica, fumed silica, synthetic silica, glass spheres, glass beads, ground glass, waste glass and glass fibers.

24. An article as claimed in claim 8, wherein the crosslinked polymer specimens of the organosilicon composition exhibit flammability characteristics which meet the UL94V-0 rating according to Underwriters Laboratories Tests for Flammability of Plastic Materials UL94 Vertical Burn Test.

25. A method for making an article of manufacture as claimed in claim 8 comprising the steps of:
(1) providing a composition comprising (a) a crosslinkable organosilicon prepolymer comprising residues of at least one silicon-containing compound and at least one polycyclic polyene compound linked through carbon to silicon bonds, when the silicon-containing compounds comprises at least one member selected from the group consisting of:
  A. cyclic polysiloxane compounds containing at least two hydrosilation reactive ≡SiH groups;
  B. tetrahedral siloxysilane compounds containing at least two hydrosilation reactive ≡SiH groups; and
  C. linear poly(organohydrosiloxane) polymers containing at least two hydrosilation reactive ≡SiH groups, wherein the polycyclic polyene compound contains at least two hydrosilation reactive carbon-carbon double bonds; wherein at least a substantial portion of at least one member selected from the group consisting of the silicon-containing compound and the polycyclic polyene compound has more than two reactive sites; and wherein about 30% to about 70% of the hydrosilation reactive ≡SiH groups are reacted; and (b) a flame retardant compound; and
(2) curing the organosilicon prepolymer in the presence of a hydrosilation catalyst to form a crosslinked organosilicon composition.

26. A method as claimed in claim 25 wherein the electronic component is coated or encapsulated with the crosslinked organosilicon polymer and the polymer contains up to 90%, by weight, of at least one filler.

27. A method as claimed in claim 26 wherein the article comprises the crosslinked organosilicon polymer.

28. An article as claimed in claim 1, wherein the polymer comprises about 2 to about 90 weight percent, based on the weight of the polymer, of the flame retardant.

29. An article as claimed in claim 1 wherein the polymer comprises about 2 to about 50 weight percent, based on the weight of the polymer, of the flame retardant.

30. An article as claimed in claim 1, wherein the polymer comprises about 3 to about 35 weight percent, based on the weight of the polymer, of the flame retardant.

31. An article of manufacture comprising a cured crosslinked organosilicon polymer wherein the article of manufacture is selected from the group consisting of an electronic component which comprises, or an electronic component coated or encapsulated with, the crosslinked organosilicon polymer and the crosslinked organosilicon polymer comprises residues of at least one silicon-containing compound and at least one polycyclic polyene compound linked through carbon to silicon bonds, wherein the silicon-containing compound comprises at least one member selected from the group consisting of:
  A. cyclic polysiloxane compounds containing at least two hydrosilation reactive ≡SiH groups;
  B. tetrahedral siloxysilane Compounds containing at least two hydrosilation reactive ==SiH groups; and
  C. linear poly(organohydrosiloxane) polymers containing at least two hydrosilation reactive ≡SiH groups;

wherein the polycyclic polyene compound contains at least two hydrosilation reactive carbon-carbon double bonds;

wherein at least a substantial portion of at least one member selected from the group consisting of the silicon compound and the polycyclic polyene compound has more than two reactive sites; and wherein the polymer comprises about 2 to about 90 weight percent, based on the weight of the polymer, of at least one phosphorus containing flame retardant.

32. An organosilicon composition as described in claim 31, wherein the flame retardant comprises at least one phosphorus containing compound.

33. An article of manufacture as described in claim 31, wherein the flame retardant comprises at least one phosphorus containing component which resides in the polymer.

34. An article of manufacture as claimed in claim 31 wherein the article of manufacture exhibits flammability characteristics which meet the criteria for the UL94 V-1 rating according to Underwriters Laboratories Tests for Flammability of Plastic Materials UL94 Vertical Burn Test.

35. An article of manufacture as claimed in claim 34, wherein the component comprises at least one member selected from the group consisting of electronic circuit boards, circuit board laminates, circuit board prepregs, semiconductor devices, capacitors, resistors, diodes, transistors, transformers, coils, wires, hybrid circuits, and multichip modules.

36. An article of manufacture as claimed in claim 35, wherein the flame retardant comprises at least one member selected from the group consisting of ammonium polyphosphates, residues of ammonium polyphosphates, phosphazenes, residues of phosphazenes, phosphine oxides, residues of phosphine oxides, phosphate esters, residues of phosphate esters and elemental red phosphorus.

37. An article as described in claim 34, wherein the polycyclic polyene compound contains two hydrosilation reactive carbon-carbon double bonds in its rings.

38. A composition as claimed in claim 35, wherein the polycyclic polyene compound contains at least two chemically distinguishable carbon-carbon double bonds in its rings.

39. An article as claimed in claim 37, wherein the polycyclic polyene is selected from the group consisting of dicyclopentadiene, tricyclopentadiene, norbornadiene dimer, bicycloheptadiene, dimethanohexahydronaphthalene, and methyl dicyclopentadiene, and the silicon containing compound is a cyclic polysiloxane.

40. An article as claimed in claim 37, wherein the ratio of hydrosilation reactive carbon-carbon double bonds in the polycyclic polyene compound and the flame retardant to hydrosilation reactive ≡SiH groups in the silicon containing compound and the flame retardant is in the range of from about 0.5:1 up to about 1.8:1.

41. An article as claimed in claim 37, wherein the ratio of hydrosilation reactive carbon-carbon double bonds in the polycyclic polyene compound and the flame retardant to hydrosilation reactive ≡SiH groups in the silicon containing compound and the flame retardant is in the range of from about 0.6:1 to about 1.3:1, and the composition comprises the flame retardant in an amount of from about 2 weight percent to about 50 weight percent, based on the weight of the composition.

42. An article as claimed in claim 39, wherein the ratio of hydrosilation reactive carbon-carbon double bonds in the polycyclic polyene and the flame retardant to hydrosilation reactive ≡SiH groups in the silicon containing compound and the flame retardant is in the range of from about 0.8:1 to about 1.1:1, and the composition comprises the flame retardant in an amount of from about 3 weight percent to about 35 weight percent, based on the weight of the composition.

43. An article as described in claim 31, wherein the polymer comprises up to 90%, by weight of the polymer, of at least one filler.

44. An article as claimed in claim 43 wherein the filler is selected from the group consisting of carbon black, vermiculite, mica, wollastonite, calcium carbonate, silica, fused silica, fumed silica, synthetic silica, glass spheres, glass beads, ground glass, waste glass and glass fibers.

45. An article as claimed in claim 31, wherein the crosslinked polymer specimens of the organosilicon composition exhibit flammability characteristics which meet the UL94V-0 rating according to Underwriters Laboratories Tests for Flammability of Plastic Materials UL94 Vertical Burn Test.

46. An article as claimed in claim 31, wherein the polymer comprises about 2 to about 50 weight percent, based on the weight of the polymer, of the flame retardant.

47. An article as claimed in claim 31, wherein the polymer comprises about 3 to about 35 weight percent, based on the weight of the polymer, of the flame retardant.

48. A method for making an article of manufacture as claimed in claims 31 comprising the steps of:
   (1) providing a composition comprising (a) a crosslinkable organosilicon prepolymer comprising residues of at least one silicon-containing compound and at least one polycyclic polyene compound linked through carbon to silicon bonds, when the silicon-containing compound comprises at least one member selected from the group consisting of:
      A. cyclic polysiloxane compounds containing at least two hydrosilation reactive ≡SiH groups;
      B. tetrahedral siloxysilane compounds containing at least two hydrosilation reactive ≡SiH groups; and
      C. linear poly(organohydrosiloxane) polymers containing at least two hydrosilation reactive ≡SiH groups, wherein the polycyclic polyene compound contains at least two hydrosilation reactive carbon-carbon double bolds; wherein at least a substantial portion of at least one member selected from the group consisting of the silicon-containing compound and that polycyclic polyene compound has more than two reactive sites; and wherein about 30% to about 70% of the hydrosilation reactive ≡SiH groups are reacted; and (b) a flame retardant compound; and
   (2) curing the organosilicon prepolymer in the presence of a hydrosilation catalyst to form a crosslinked organosilicon composition.

49. A method as claimed in claim 48 wherein the electronic component is coated or encapsulated with the crosslinked organosilicon polymer and the polymer contains up to 90%, by weight, of at least one filler.

50. A method as claimed in claim 49 wherein the article comprises the crosslinked organosilicon polymer.

* * * * *

UNITED STATES PATENT AND TRADEMARK OFFICE
CERTIFICATE OF CORRECTION

PATENT NO. : 5,466,512
DATED : November 14, 1995
INVENTOR(S) : Laura M. Babcock, John K. Bard & Raymond T. Leibfried, Sr.

It is certified that error appears in the above-indentified patent and that said Letters Patent is hereby corrected as shown below:

Claim 2, Column 26, Line 37, following "one" insert -- halogen containing compound--.

Claim 13, Column 27, Line 9, replace "flamer" with --dimer--.

Claim 31, Column 28, Line 64, replace "Compounds" with --compounds--.

Claim 48, Column 30, Line 47, replace "bolds" with --bonds--; and Column 30, Line 49, replace "that" with --the--.

Signed and Sealed this

Tenth Day of December, 1996

Attest:

BRUCE LEHMAN

Attesting Officer

Commissioner of Patents and Trademarks